(12) United States Patent
Watakabe et al.

(10) Patent No.: US 12,237,345 B2
(45) Date of Patent: *Feb. 25, 2025

(54) SEMICONDUCTOR DEVICE

(71) Applicant: Japan Display Inc., Tokyo (JP)

(72) Inventors: Hajime Watakabe, Tokyo (JP); Isao Suzumura, Tokyo (JP); Akihiro Hanada, Tokyo (JP); Yohei Yamaguchi, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/366,859

(22) Filed: Aug. 8, 2023

(65) Prior Publication Data

US 2023/0387146 A1  Nov. 30, 2023

Related U.S. Application Data

(63) Continuation of application No. 17/459,423, filed on Aug. 27, 2021, now Pat. No. 11,764,233, which is a
(Continued)

(30) Foreign Application Priority Data

Oct. 26, 2017  (JP) ................................. 2017-207026

(51) Int. Cl.
  *H01L 27/12* (2006.01)
  *H01L 29/24* (2006.01)
  (Continued)

(52) U.S. Cl.
  CPC ...... *H01L 27/1292* (2013.01); *H01L 27/1225* (2013.01); *H01L 29/24* (2013.01);
  (Continued)

(58) Field of Classification Search
  CPC . H01L 27/1292; H01L 27/12; H01L 27/1225; H01L 29/24; H01L 29/66757;
  (Continued)

(56) References Cited

U.S. PATENT DOCUMENTS 11,133,337 B2 *  9/2021  Watakabe ........... H01L 29/7869
11,764,233 B2 *  9/2023  Watakabe ......... H01L 29/78696
                                                                257/79

(Continued)

FOREIGN PATENT DOCUMENTS

JP    2012-099757 A    5/2012
JP    2014-053590 A    3/2014
JP    2017-126693 A    7/2017

OTHER PUBLICATIONS

Japanese Office Action dated Aug. 15, 2023, for the corresponding Japanese Patent Application No. 2022-115423, with English translation.

*Primary Examiner* — Nikolay K Yushin
(74) *Attorney, Agent, or Firm* — Michael Best & Friedrich LLP

(57) ABSTRACT

A display device including a substrate having thin film transistors (TFT) comprising: the TFT including an oxide semiconductor film, a gate electrode and an insulating film formed between the oxide semiconductor film and the gate electrode, wherein a first aluminum oxide film and a second aluminum oxide film, which is formed on the first aluminum oxide film, are formed between the insulating film and the gate electrode, an oxygen concentration in the first aluminum oxide film is bigger than an oxygen concentration in the second aluminum oxide film.

6 Claims, 15 Drawing Sheets

Related U.S. Application Data continuation of application No. 16/852,925, filed on Apr. 20, 2020, now Pat. No. 11,133,337, which is a continuation of application No. PCT/JP2018/028405, filed on Jul. 30, 2018.

(51) Int. Cl.
*H01L 29/66* (2006.01)
*H01L 29/786* (2006.01)

(52) U.S. Cl.
CPC .. *H01L 29/66757* (2013.01); *H01L 29/66969* (2013.01); *H01L 29/78666* (2013.01); *H01L 29/7869* (2013.01)

(58) Field of Classification Search
CPC ............... H01L 29/66; H01L 29/66969; H01L 29/78666; H01L 29/786; H01L 29/7869; H01L 29/4908; H01L 29/49; H01L 29/78696; G02F 1/1368; G02F 1/00; G02F 1/13685; G09F 9/30; G09F 9/00; G09F 9/301
See application file for complete search history.

(56) References Cited

U.S. PATENT DOCUMENTS

| | | |
|---|---|---|
| 2012/0112182 A1 | 5/2012 | Ishii et al. |
| 2014/0061632 A1 | 3/2014 | Lee et al. |
| 2017/0207245 A1 | 7/2017 | Hanada et al. |

* cited by examiner

SEMICONDUCTOR DEVICE

CLAIM OF PRIORITY

The present application is a continuation application of U.S. patent application Ser. No. 17/459,423, filed Aug. 27, 2021, which, in turn, is a continuation application of U.S. patent application Ser. No. 16/852,925 (now U.S. Pat. No. 11,133,337), filed Apr. 20, 2020, which, in turn, is a continuation application of International Application No. PCT/JP2018/028405, filed on Jul. 30, 2018, which claims priority to Japanese Patent Application NO. 2017-207026, filed on Oct. 26, 2017, the contents of these applications are incorporated herein by reference in their entirety.

BACKGROUND OF THE INVENTION

(1) Field of the Invention

The present invention relates to the display device using oxide semiconductor TFTs, wherein increase of leak current due to decrease of resistance in the channel caused by reduction of the oxide semiconductor is suppressed.

(2) Description of the Related Art

A liquid crystal display device has a TFT substrate, a counter substrate opposing to the TFT substrate, and a liquid crystal layer sandwiched between the TFT substrate and the counter substrate. The TFT substrate has plural pixels arranged in matrix; each of the pixels has a pixel electrode and a Thin Film Transistor (TFT). A transmittance of light in each of the pixels is controlled by liquid crystal molecules; thus, images are formed. On the other hand, the organic EL display device displays color images by arranging pixels, which emit light, in matrix; each of the pixels has an organic EL display layer, TFTs, and others. The organic EL display device does not need the backlight; thus it is more suitable for a flexible display device.

In the display device, the TFTs are used as switching elements in the pixels, or for the peripheral driving circuits, etc. Since the TFT of the oxide semiconductor has high OFF resistance, it is suitable for a switching transistor. In addition, the TFT of the oxide semiconductor has a merit that it can be manufactured by lower process temperature than that of the TFT of the a-Si (amorphous silicon).

In the display device, several insulating films are used as interlayer insulating films. Even a silicon oxide (SiO) film and a silicon nitride (SiN) film are mainly used for the insulating films, an aluminum oxide film is occasionally used for an interlayer insulating film. The patent document 1 discloses: forming the gate electrode by aluminum; forming the aluminum oxide on the surface of the aluminum by anode oxidization; thus, improving adhesive strength between the gate electrode and the resist. The patent document 1 also discloses the aluminum oxide in the through hole is eliminated by etching after the through hole is formed.

PRIOR ART DOCUMENTS

Patent Document 1

Japanese patent application laid open No. Hei 9-213968

SUMMARY OF THE INVENTION

In the TFT of the oxide semiconductor, leak current of the TFT increases when the resistance of the channel decreases due to the reduction of the oxide semiconductor in the channel. One reason of the reduction of the oxide semiconductor is that oxygen is extracted from the oxide semiconductor by metal. The gate electrode made of metal is set above the oxide semiconductor via an insulating film. Therefore, there is a risk that the oxygen is extracted by the gate electrode from the oxide semiconductor through the insulating film.

In the meantime, the oxygen rich SiO film contacts the channel of the oxide semiconductor film and supplies oxygen to the oxide semiconductor. When concentration of the oxygen in the SiO film decreases, however, supply of the oxygen to the oxide semiconductor decreases; consequently, the oxide semiconductor tends to be reduced easily.

The purpose of the present invention is to suppress the phenomenon that oxygen is extracted from the oxide semiconductor film; thus, to realize the TFT, in which leak current is kept low.

The present invention overcomes the above explained problem; the concrete structures are as follows.

(1) A display device including a substrate having thin film transistors (TFT) comprising:
the TFT including an oxide semiconductor film, a gate electrode and an insulating film formed between the oxide semiconductor film and the gate electrode,
wherein a first aluminum oxide film and a second aluminum oxide film, which is formed on the first aluminum oxide film, are formed between the insulating film and the gate electrode,
an oxygen concentration in the first aluminum oxide film is bigger than an oxygen concentration in the second aluminum oxide film.

(2) A display device including a substrate having thin film transistors (TFT) comprising:
the TFT including an oxide semiconductor film, a gate electrode and an insulating film formed between the oxide semiconductor film and the gate electrode,
wherein an aluminum oxide film is formed between the insulating film and the gate electrode,
an oxygen concentration in the aluminum oxide film is bigger at a side of the insulating film than an oxygen concentration at a side of the gate electrode.

(3) A manufacturing method of a display device comprising:
the display device including a substrate in which the thin film transistors (TFT) are formed,
the TFT including an oxide semiconductor film, a gate electrode and an insulating film formed between the oxide semiconductor film and the gate electrode,
wherein
forming a first aluminum oxide film on the insulating film,
forming a second aluminum oxide film on the first aluminum oxide film, an oxygen concentration of the second aluminum oxide film is smaller than an oxygen concentration of the first aluminum oxide film,
forming a metal for the gate electrode, and
patterning the gate metal, the second aluminum oxide film and the first aluminum oxide film.

(4) A manufacturing method of a display device comprising:
the display device including a substrate in which the thin film transistors (TFT) are formed,
the TFT including an oxide semiconductor film, a gate electrode and an insulating film formed between the oxide semiconductor film and the gate electrode,
wherein
forming a first aluminum oxide film on the insulating film, forming a gate electrode, patterning the gate electrode, forming a second aluminum oxide film between the gate electrode and the first aluminum oxide film by annealing the gate electrode.

DETAILED DESCRIPTION OF THE PREFERRED EMBODIMENTS

The present invention will be described in detail referring to the following embodiments. In the explanation below, the invention is mainly explained by examples of the liquid crystal display device; however, the present invention is applicable to the organic EL display device and other display devices, too.

First Embodiment

Figure 1:
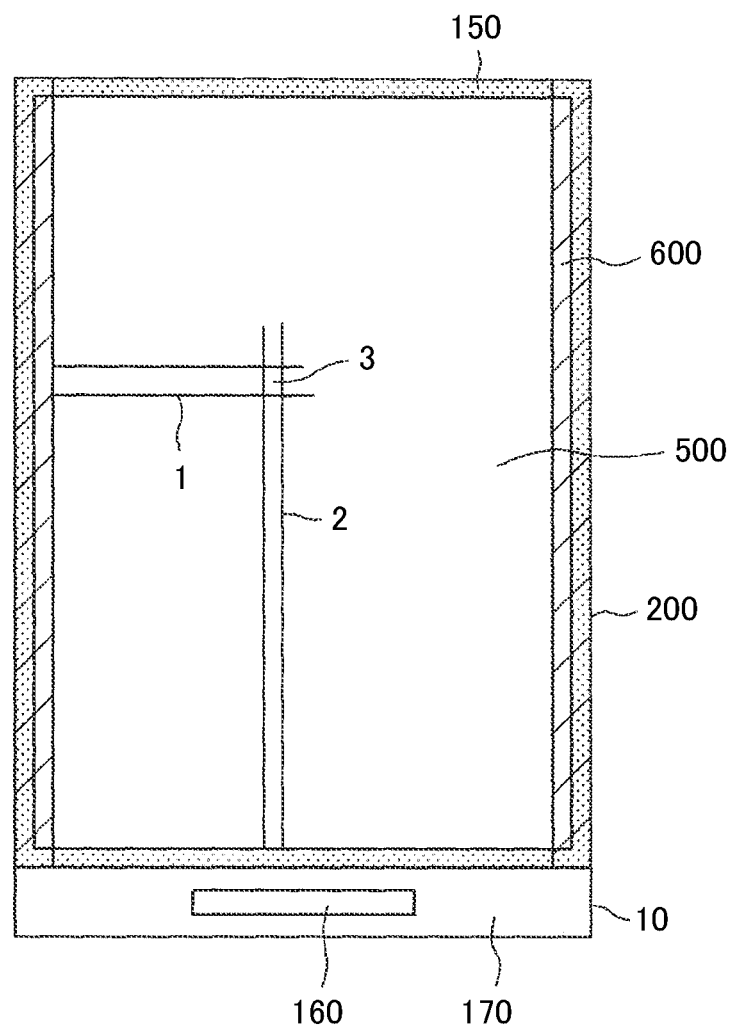
FIG. 1 is a plan view of the liquid crystal display device.
Figure 1:
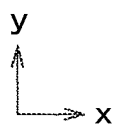

FIG. 1 is a plan view of a liquid crystal display device, which the present invention is applied. In FIG. 1, the TFT substrate 10 in which TFTs and pixel electrodes are formed and the counter substrate 200 adhere to each other at their periphery by the sealing material 150; the liquid crystal is sandwiched between the TFT substrate 10 and the counter substrate 200. The area surrounded by the sealing material 150 is the display area 500. The peripheral driving circuits 600 are formed at both sides of the display area 500; a part of the peripheral driving circuits 600 overlaps with the sealing material 150 in a plan view.

In FIG. 1, in the display area 500, the scanning lines 1 extend in the lateral direction (x direction) from the peripheral driving circuits 600 and are arranged in the longitudinal direction (y direction). The video signal lines 2 extend in the longitudinal direction and are arranged in the lateral direction. Video signals are supplied to the video signal lines 2 from driver IC 160, which is installed in the terminal area 170. The pixel 3 is formed in the area surrounded by the scanning lines 1 and the video signal lines 2.

In FIG. 1, the TFT substrate 10 is made bigger than the counter substrate 200; the area of the TFT substrate 10 that does not overlap with the counter substrate 200 is the terminal area 170 where the driver IC 160 is installed. In the meantime, the flexible wiring substrate is connected to the terminal area 170 to supply power and signals to the liquid crystal display device.

The TFTs of the oxide semiconductor are used in the liquid crystal display device of FIG. 1. The TFT of the oxide semiconductor has a feature of low leak current; therefore, it is suitable for the switching element in the pixel in the display area. On the other hand, the TFT of the poly silicon semiconductor has a high leak current, however, the mobility of carriers is high; thus, it is sometimes used for the driving TFTs in the peripheral driving circuit.

Figure 2:
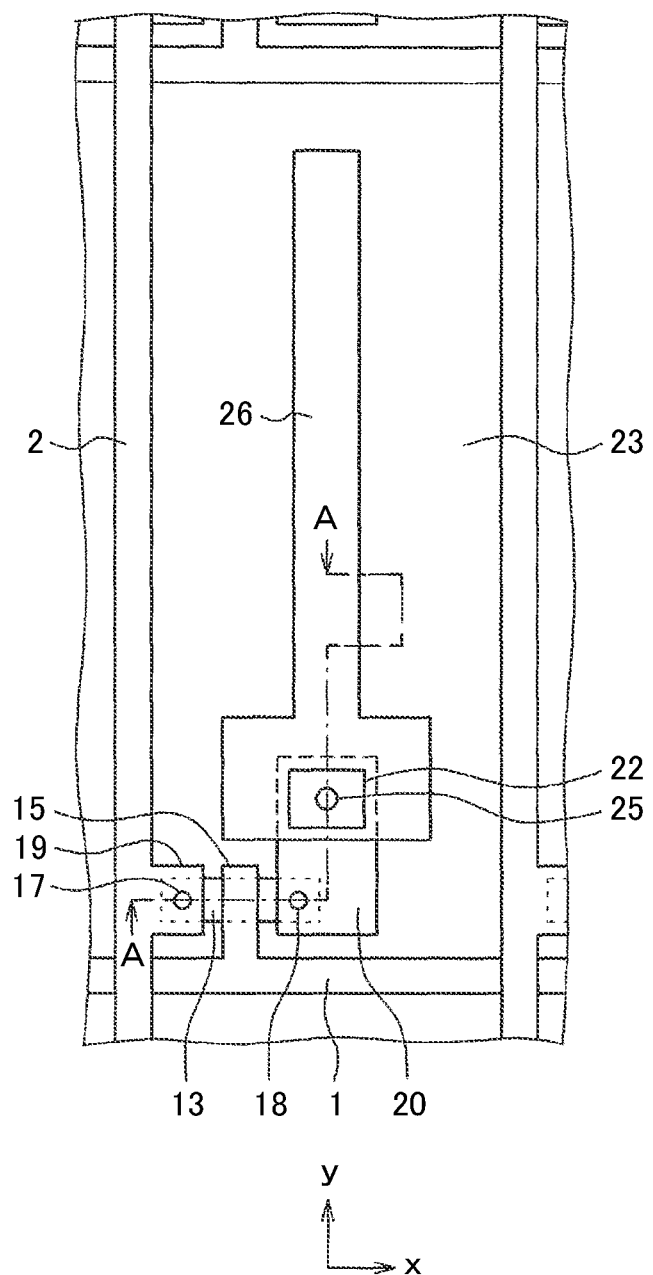
FIG. 2 is a plan view of the pixel in the display area of the liquid crystal display device.

FIG. 2 is a plan view of the pixel in the display area 500 of the TFT substrate 10. In FIG. 2, the scanning lines 1 extend in the lateral direction (x direction) and are arranged in the longitudinal direction (y direction). The video signal lines 2 extend in the longitudinal direction and are arranged in the lateral direction. The pixel electrode 26 and the TFT are formed in the area surrounded by the scanning lines 1 and the video signal lines 2. The TFT in FIG. 2 is a top gate type TFT.

In FIG. 2, the active element (the semiconductor layer) of the TFT is formed by the oxide semiconductor 13. The TFT of the oxide semiconductor 13 has a feature of low leak current. Among the oxide semiconductors 13, optically transparent and amorphous materials are called TAOS (Transparent Amorphous Oxide Semiconductor). Examples of TAOS are indium gallium zinc oxide (IGZO), indium tin zinc oxide (ITZO), zinc oxide nitride (ZnON), and indium gallium oxide (IGO). IGZO is used as the oxide semiconductor 13 in the present embodiments.

In FIG. 2, the gate electrode 15 is formed above the oxide semiconductor film 13 via the insulating film. The gate electrode 15 is a branch of the scanning line 1. The channel of the TFT is formed immediately below the gate electrode 15 via the insulating film in the oxide semiconductor film 13. One side, toward the video signal line, of the oxide semiconductor is the drain, and another side, opposite to the one side of the oxide semiconductor, is the source.

In FIG. 2, the drain electrode 19 is connected to the oxide semiconductor film 13 via through hole 17. The drain electrode 19 is a branch of the video signal line 2. The source electrode 20 is connected to the source of the oxide semiconductor film 13 via through hole 18. The source electrode 20 is connected to the pixel electrode 26 via the through hole 22 formed in the organic passivation film and the through hole 25 formed in the capacitance insulating film.

The pixel electrode 26 is stripe shaped. The common electrode 23 is formed in a plane shape under the pixel electrode 26 via the capacitance insulating film. The common electrode 23 is formed all over the area except the through hole 22. When the video signal is applied to the pixel electrode 26, a line of force is generated between the common electrode 23 and the pixel electrode 26 through the liquid crystal layer; consequently, liquid crystal molecules are rotated and thus, the transmittance in each of the pixels is changed.

In the example of FIG. 2, the pixel electrode 26 is constituted by one stripe since the lateral size of the pixel is small as 30 microns. When the lateral size of the pixel becomes bigger, however, the shape of the pixel electrode 26 becomes comb shaped, which has a slit inside. FIG. 2 is a structure that is used in so called IPS (In Plane Switching) mode liquid crystal display device.

Figure 3:
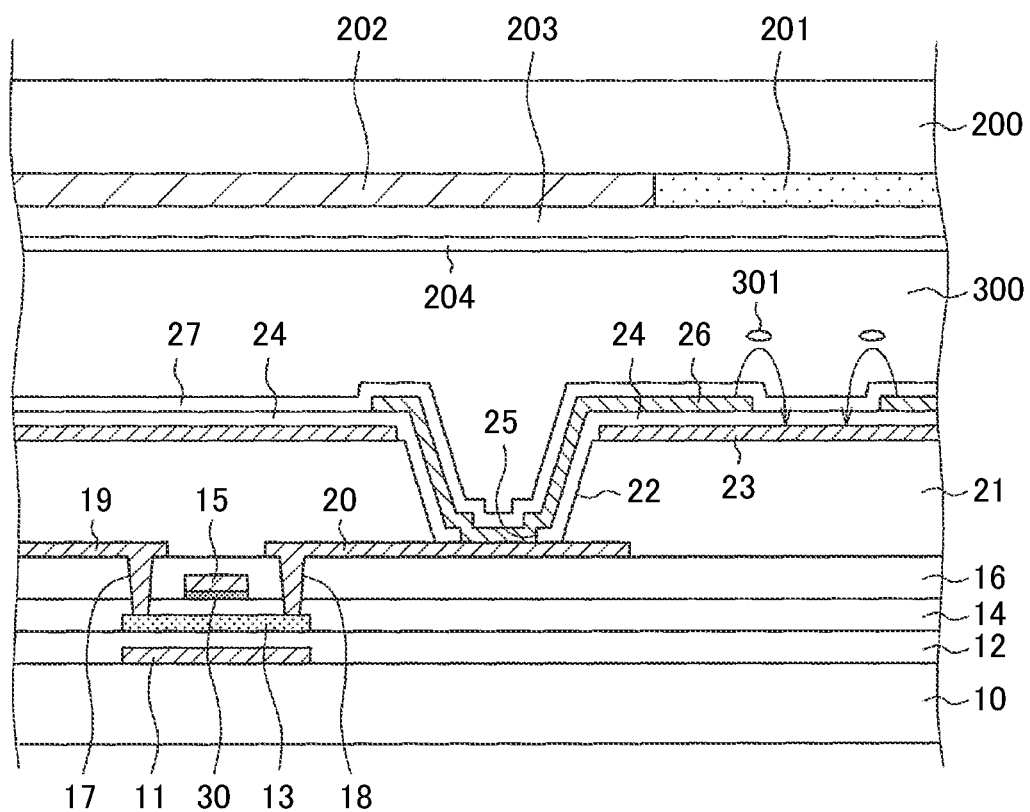
FIG. 3 is a cross sectional view of the liquid crystal display device.

FIG. 3 is a cross sectional view along the line A-A of FIG. 2. In FIG. 3, the light shading film 11 is formed on the TFT substrate 10, which is made of glass, etc. If a flexible display device is required, the TFT substrate 10 is made of resin as polyimide.

The light shading film stops the light from the backlight for the oxide semiconductor film 13, which is formed above the light shading film; thus, photo current in the oxide semiconductor film 13 is suppressed. The light shading film 11 is made of metal as MoW, etc. The light shading film 11 can utilize the same material as the gate electrode 15, which is formed later.

The under coat film 12 is formed over the light shading film 11. The under coat film 12 prevents the oxide semiconductor film 13 from being contaminated by impurities in the TFT substrate 10 made of e.g. glass, as well as insulates the light shading film 11 from the oxide semiconductor film 13. The under coat film 12 is generally has a two layer structure of the SiN film and the SiO film; the SiO film contacts the oxide semiconductor film 13, which is made on the SiO film.

In the meantime, as to be explained in fourth embodiment, some products use the light shading film 11 as the bottom gate for the oxide semiconductor film 13. In this case, the under coat film 12 works as the gate insulating film. The second under coat film can be additionally used between the light shading film 11 and the substrate 10. In this case, the second under coat film, too, may be formed by two layers of the SiO film and the SiN film.

In FIG. 3, the oxide semiconductor film 13 is formed on the under coat film 12. IGZO is used for the oxide semiconductor film 13. A thickness of the oxide semiconductor film 13 is 15 to 100 nm. The oxide semiconductor film 13 is formed by sputtering. The insulating film 14 of SiO is formed on the oxide semiconductor film 13. Generally, the gate electrode 15 is formed on the insulating film 14, however, in the present invention, aluminum oxide film 30 is formed between the gate electrode 15 and the insulating film 14. The aluminum oxide film 30 has a two layer structure.

The interlayer insulating film 16 is formed over the gate electrode 15. The interlayer insulating film 16 can have a one layer structure of SiO film or can have a two layer structure of SiO film and SiN film. When the two layer structure is adopted, the lower layer is the SiO film and the upper layer is the SiN film.

In FIG. 3, the portion of the oxide semiconductor 13 immediately under the gate electrode 15 is the channel; the left hand side is the drain, the right hand side is the source. The drain and the source are formed by ion implantation of e.g. Ar using the gate electrode 15 as a mask.

In FIG. 3, through holes 17 and 18 are formed in the interlayer insulating film 16 and the insulating film 14. The drain electrode 19 and the drain are connected via the through hole 17 and the source electrode 20 and the source are connected via the through hole 18.

In FIG. 3, the organic passivation film 21 is formed covering the drain electrode 19 and the source electrode 20. Since the organic passivation film 21 has a role as a flattening film, it is formed thick as 2 micron to 4 micron. The common electrode 23 is formed in plane shape on the organic passivation film 21; the capacitance insulating film 24 is formed on the common electrode 23.

The pixel electrode 26 is formed on the capacitance insulating film 24. An example of a plan view of the pixel electrode 26 is shown in FIG. 2. The pixel capacitance is formed between the common electrode 23 and the pixel electrode 26 through the capacitance insulating film 24.

In FIG. 3, the through hole 22 is formed in the organic passivation film 21 and the through hole 25 is formed in the capacitance insulating film 24 to connect the pixel electrode 26 to the source electrode 20. The alignment film 27 is formed on the pixel electrode 26. The alignment film 27 is for initial alignment of the liquid crystal molecules 301; the alignment is conducted through the rubbing method or the optical alignment method using ultra violet ray. In the case of IPS mode, the optical alignment method is suitable. When video signals are applied to the pixel electrode 26, a line of force as depicted by arrows in FIG. 3 is generated between the pixel electrode 26 and the common electrode 23 and liquid crystal molecules 301 are rotated; consequently, the transmittance of the liquid crystal layer 300 is controlled.

In FIG. 3, the counter substrate 200 is set opposing to the TFT substrate 10 sandwiching the liquid crystal layer 300. Generally, the counter substrate 200 is formed by glass; the resin like polyimide is used for the counter substrate 200 when a flexible display device is required. The color filter 201 and the black matrix 202 are formed on an inner side of the counter substrate 200. The over coat film 203 is formed covering the color filter 201 and the black matrix 202. The alignment film 204 is formed on the over coat film 203. The alignment process for the alignment film 204 is the same as that of the alignment film 32 on the TFT substrate 10.

Figure 4:
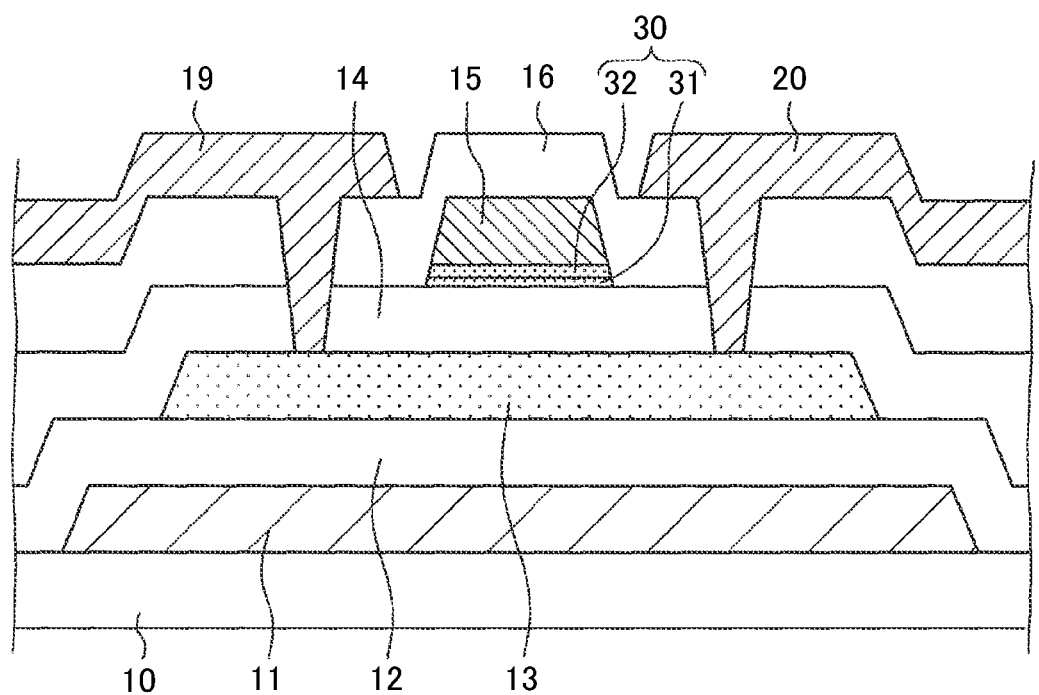
FIG. 4 is a detailed cross sectional view of the TFT and its vicinity.

FIG. 4 is a cross sectional view of the TFT and its vicinity to show the feature of this embodiment. In FIG. 4, the light shading film 11 is formed on the substrate 10; the under coat film 12 is formed on the light shading film 11; and the oxide semiconductor film 13 is formed on the under coat film 12. The oxide semiconductor film 13 is formed by IGZO. The insulating film 14 is formed covering the oxide semiconductor film 13. The insulating film 14 is formed by oxide rich SiO to maintain the amount of oxygen in the oxide semiconductor film 13.

The gate electrode 15 is formed over the insulating film 14, however, the aluminum oxide film 30, which has a two layer structure of the first aluminum oxide film 31 and the second aluminum oxide film 32, is formed between the gate electrode 15 and the insulating film 14. As will be explained later, the first aluminum oxide film 31 and the second aluminum oxide film 32 are formed to maintain the amount of oxygen in the oxide semiconductor film 13.

The gate electrode 15 is made of either Titanium (Ti) or Aluminum (Al). In this specification, the aluminum alloy that contains aluminum as a major substance like AlSi and so forth is also expressed as aluminum. The interlayer insulating film 16 is formed covering the gate electrode 15. The through holes 17 and 18 are formed in the interlayer insulating film 16 and the insulating film 14 to connect the oxide semiconductor film 13 and the drain electrode 19 or to connect the oxide semiconductor film 13 and the source electrode 20.

Figure 5:
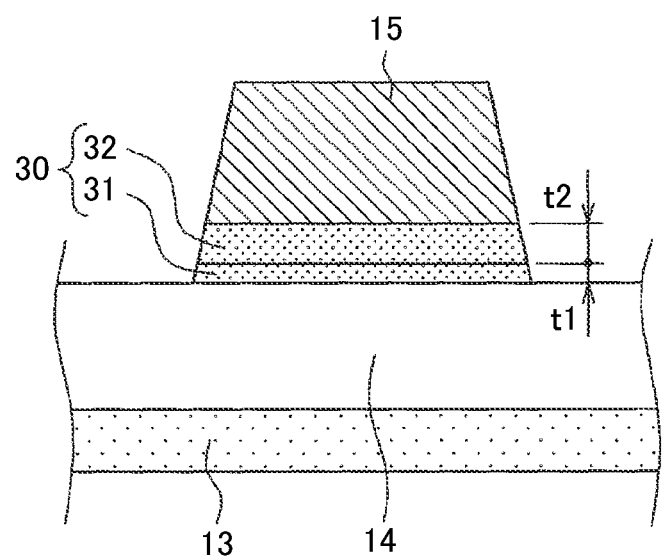
FIG. 5 is an enlarged cross sectional view of the gate electrode and its vicinity.

FIG. 5 is an enlarged cross sectional view of the gate electrode 15 and its vicinity. The feature of this embodiment is to form the first aluminum oxide film 31 and the second aluminum oxide film 32 between the gate electrode 15 and the insulating film 14. In FIG. 5, at the outset, the first aluminum oxide film 31 is formed in a thickness of 2 nm by sputtering. The first aluminum oxide film 31 is made oxygen rich film formed by oxygen reactive mode sputtering, namely, sputtering in the oxygen environment. Since the oxygen reactive mode sputtering gives some damage to the insulating film 14, a thickness of the first aluminum oxide film 31 is limited to between 2 to 5 nm, preferably 2 nm. Since deposition rate in the oxygen reactive mode sputtering is low, it takes approximately 1 minute to deposit the first aluminum oxide film in 2 nm.

Subsequently, the second aluminum film 32 is formed by transition mode sputtering, decreasing the amount of oxygen in the sputtering chamber. A thickness of the second aluminum oxide film 32 is made 5 to 10 nm. In the transition mode sputtering, the deposition rate is higher than that in the oxygen reactive mode sputtering. The aluminum oxide film formed by transition mode sputtering has lower oxygen content than that of the aluminum oxide film formed by oxygen reactive mode sputtering. In other words, when aluminum oxide is expressed by AlyOx, the value x/y is bigger in the aluminum oxide formed by the oxygen reactive mode than in the aluminum oxide formed by the transition mode.

Figure 6:
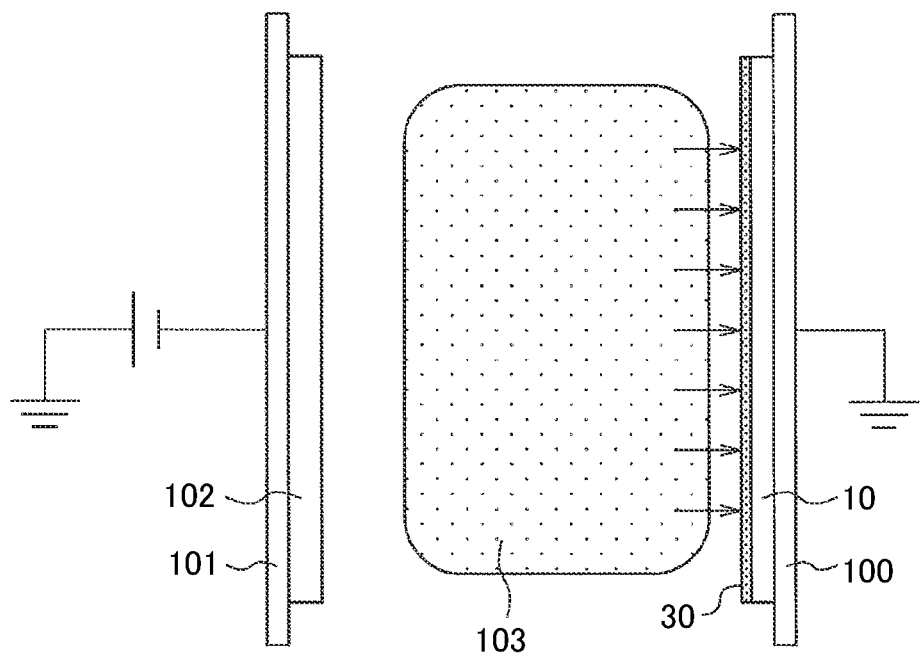
FIG. 6 is a cross sectional view of the sputtering equipment.

FIG. 6 is a cross sectional view in the sputtering equipment. In FIG. 6, the cathode 101 and the anode 100 oppose to each other with predetermined distance. The aluminum target 102 is set on the cathode 101. The substrate 10, on which the sputtering film 30 is deposited, is set on the anode 100.

The plasma 103 for sputtering is formed by adding predetermined gasses and applying a voltage. The gas is oxygen (02) added Argon (Ar); the sputtering mode is determined by the amount of oxygen.

Figure 7:
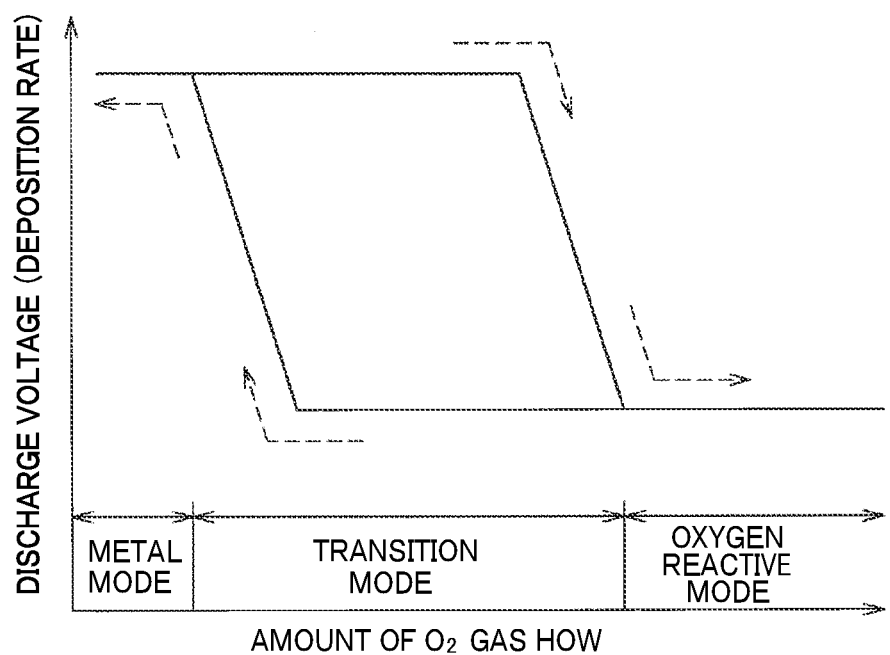
FIG. 7 is a graph that shows sputtering modes.

FIG. 7 is a graph showing the sputtering modes. In FIG. 7, the abscissa is the amount of flow of oxygen. The sputtering mode is changed from the metal mode, to the transition mode, and to the oxygen reactive mode according to the amount of flow of oxygen. The amount of flow of Argon is constant in all the modes. The film formed under the oxygen reactive mode sputtering contains a large amount of oxygen; the film formed under the metal mode sputtering becomes an aluminum film or a film that contains extremely low amount of oxygen; the film formed under the transition mode sputtering contains an amount of oxygen in between. In other words, when aluminum oxide is expressed by AlyOx, the value x/y becomes bigger according the amount of flow of oxygen in the sputtering process.

The ordinate of FIG. 7 is a discharge voltage. The discharge voltage is proportional to the deposition rate. Namely, the deposition rate is high in the metal mode and in the transition mode; the deposition rate is low in the oxygen reactive mode.

Figure 8:
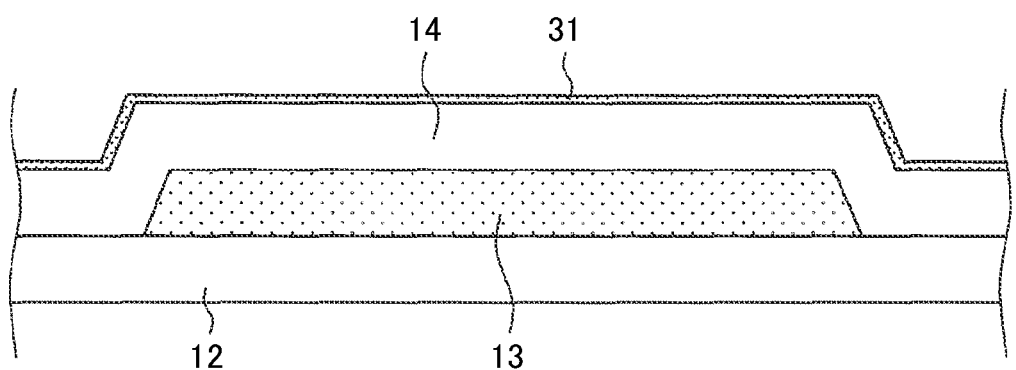
FIG. 8 is a cross sectional view that the first aluminum oxide film is formed on the insulating film.

FIGS. 8-12 are cross sectional views of the process that realizes the structure of FIG. 5. FIG. 8 is a cross sectional view that shows the first aluminum oxide film 31 is formed on the insulating film 14 by oxygen reactive mode sputtering. A thickness of the first aluminum film 31 is e.g. 2 nm. Since the deposition rate in the oxygen reactive mode is low, approximately 1 minute sputtering is necessary for 2 nm deposition.

During the oxygen reactive mode sputtering, an excessive amount of oxygen can be implanted in the insulating film 14, which is made of SiO, there is a chance that the insulating film 14 gets damage; consequently the reliability of the TFT could decrease. Therefore, a thickness of the first aluminum oxide film 31, which is formed by oxygen reactive mode sputtering, is preferably 5 nm or less, and most preferably 2 nm. In addition, since particles are tend to be generated in the oxygen reactive mode sputtering, it is preferable to keep the thickness of the first aluminum oxide film 31 thin from this aspect too. By the way, even the thickness of the first aluminum oxide film 31 is as thin as 2 nm, the thickness can be measured by TEM (Transmission Electron Microscopy).

Figure 9:
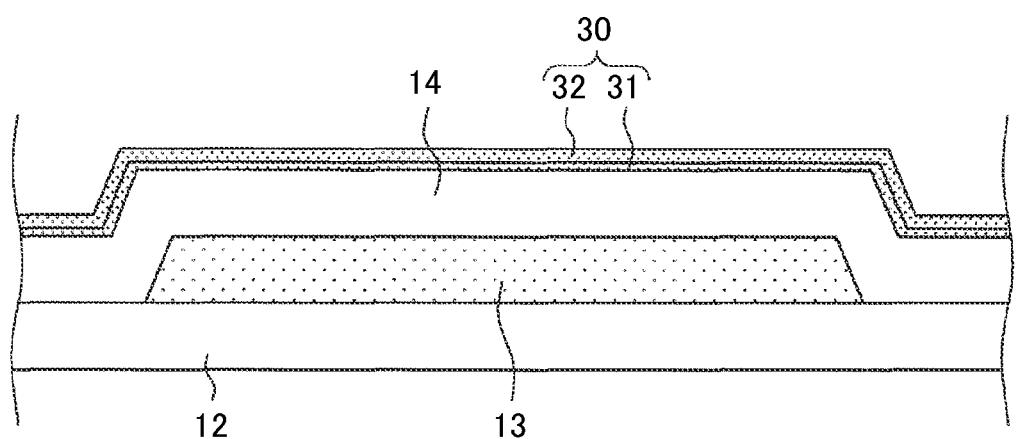
FIG. 9 is a cross sectional view that the second aluminum oxide film is formed on the first aluminum oxide film.

FIG. 9 is a cross sectional view that the second aluminum oxide film 32 is formed by sputtering on the first aluminum oxide film 31. The second aluminum oxide film 32 is formed by the transition mode sputtering. Damage to the insulating film 14 due to oxygen is lower in the transition mode sputtering compared with that in the oxygen reactive mode sputtering. The deposition rate in the transition mode is high and a chance of generation of particles during the transition mode sputtering is low.

However, since the membrane stress of the aluminum oxide film formed by transition mode sputtering tends to be high, peeling off of the film tends to occur when the film is made thick. Therefore, a thickness of the second aluminum oxide film 32 is preferably 5 to 15 nm.

Figure 10:
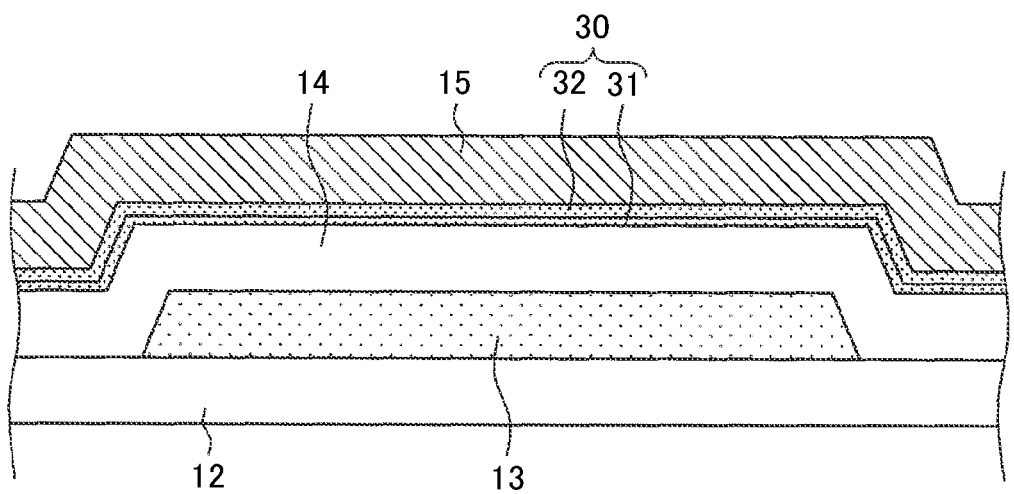
FIG. 10 is a cross sectional view that the metal for the gate electrode is formed on the second aluminum oxide film.

FIG. 10 is a cross sectional view that the metal, which is to be the gate electrode 15, is formed by sputtering on the second aluminum oxide film 32. The metal for the gate electrode 15 is e.g. Ti, Al, MoW or so forth. The metal, especially Ti and Al, easily absorb oxygen. Therefore, the metal extracts oxygen from the oxide semiconductor film 13 through the insulating film 14. In this embodiment, however, the first aluminum oxide film 31 and the second aluminum oxide film 32 are formed beforehand, thus, those films can be block films to prevent extraction of oxygen from the oxide semiconductor film 13.

Figure 11:
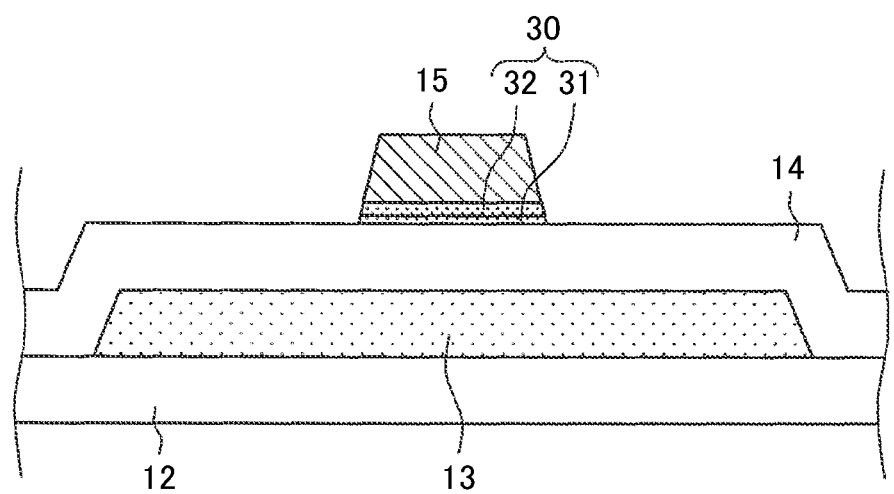
FIG. 11 is a cross sectional view that the gate electrode, the second aluminum oxide film and the first aluminum oxide film are patterned.
Figure 12:
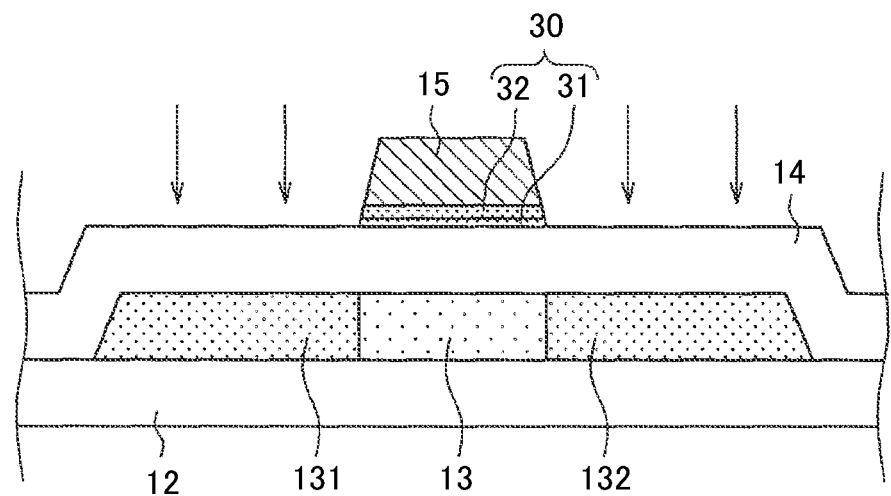
FIG. 12 is a cross sectional view that ion implantation is being conducted.

FIG. 11 is a cross sectional view that the gate electrode 15, the second aluminum oxide film 32 and the first aluminum oxide film 31 are patterned. FIG. 12 is a cross sectional view wherein after the gate electrode 15 is patterned, ion implantation is conducted using the gate electrode 15 as the mask to implant e.g. Ar in the oxide semiconductor film 13, except the portion under the gate electrode 15, to give conductance to the oxide semiconductor film 13.

The first aluminum oxide film 31 and the second aluminum oxide film 32 exist under the gate electrode 15. The second aluminum oxide film 32 prevents the extraction of the oxygen by the gate electrode 15 from the oxide semiconductor film 13; the first aluminum oxide film 31, which is oxygen rich film, supplies oxygen to the oxide semiconductor film 13 through the insulating film 14.

As described above, TFTs of stable characteristics having the oxide semiconductor film 13 as the active layer can be realized according to the first embodiment.

Second Embodiment

Figure 13:
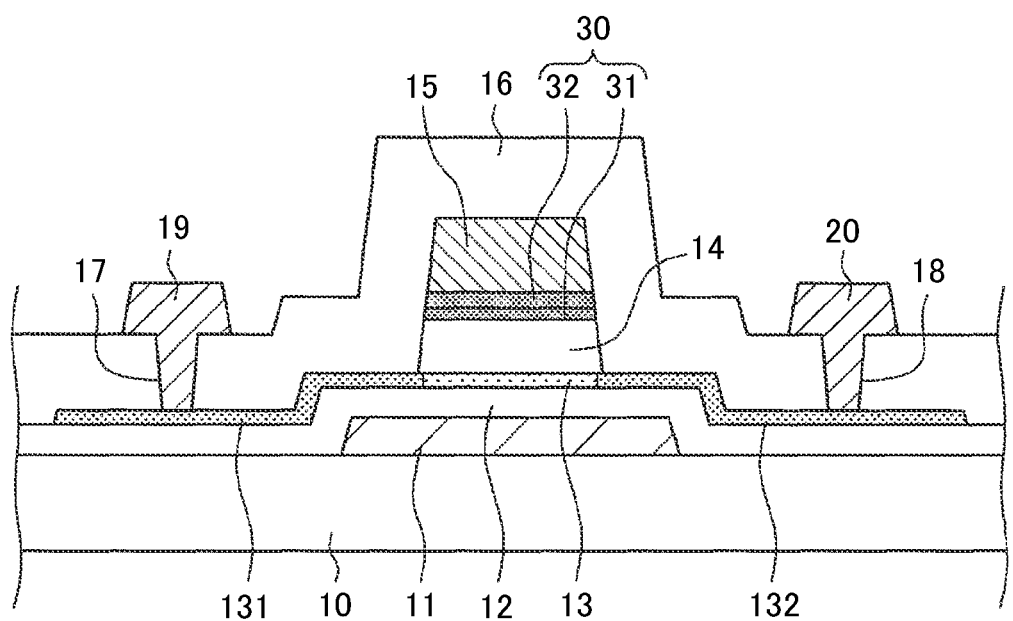
FIG. 13 is a cross sectional view of second embodiment.

FIG. 13 is a cross sectional view according to second embodiment. FIG. 13 differs from FIG. 4 in that the insulating film 14 is formed only under the gate electrode 15. Namely, the oxide rich insulating film 14 is formed only under the gate electrode 15. In the oxide semiconductor film 13, it is only channel region in which supplying of the oxygen is necessary or preventing extraction of oxygen is necessary.

The region of the oxide semiconductor film 13 other than the channel, namely the drain region and the source region, should be conductive; therefore, it is preferable that oxygen does not exist in this region. In the structure of FIG. 13, since oxygen rich insulating film 14 does not exist on the drain and the source, unnecessary oxygen is not supplied to the oxide semiconductor film 13.

In FIG. 13, the interlayer insulating film 16 contacts the drain and the source of the oxide semiconductor film 13. The interlayer insulating film 16 can be made of SiO film, the SiO film that constitutes the interlayer insulating film 16 contains less oxygen than the insulating film 14 does; therefore, supply of oxygen to the drain and the source of the oxide semiconductor film 13 from the interlayer insulating film 16 is limited.

As described above, in the structure of FIG. 13, the first aluminum oxide 31 can supply oxygen to the channel of the oxide semiconductor film 13 for which supplying of the oxygen is necessary; the second aluminum oxide film 32 prevent extraction of the oxygen by the gate electrode 15 from the oxide semiconductor film 13 through the insulating film 14. In addition to that, the insulating film 14 does not excessively supply oxygen to the drain and the source; thus, TFTs of oxide semiconductor having stable characteristics can be manufactured.

Third Embodiment

Figure 14:
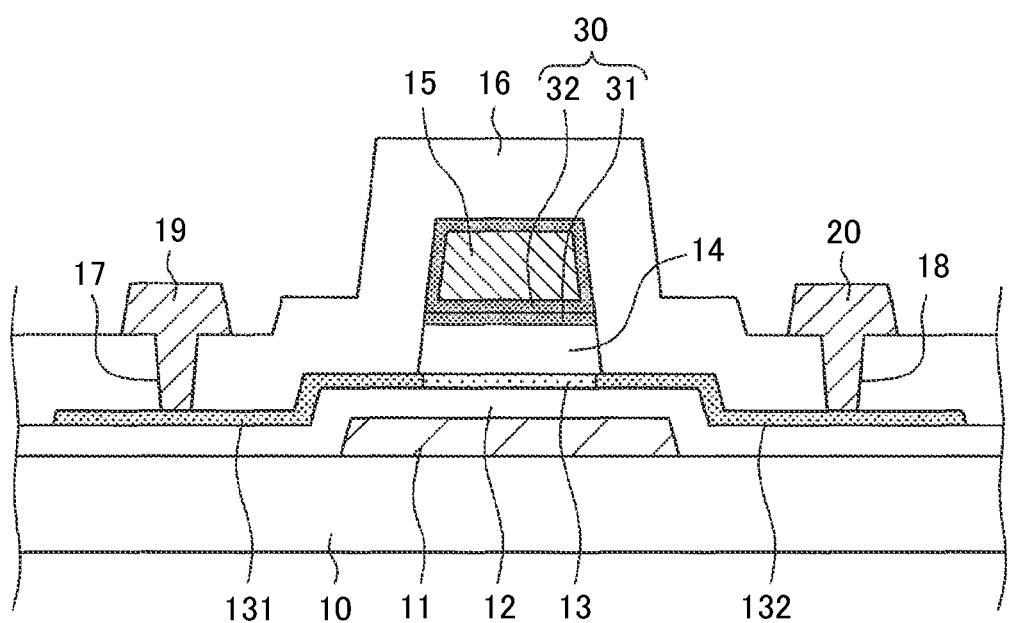
FIG. 14 is a cross sectional view of third embodiment.

FIG. 14 is a cross sectional view that shows third embodiment. FIG. 14 differs from FIG. 13 of second embodiment in that the second aluminum oxide film 32 is formed by oxidation in the annealing process, not the film formed by sputtering. The process is as follows: the gate electrode 15 is formed by aluminum; after the gate electrode 15 is patterned, the surface of the gate electrode 15 is oxidized in the annealing process to form the second aluminum oxide film 32.

After the gate electrode 15 is patterned, the drain and the source of the oxide semiconductor 13 is given conductivity by driving in Ar and so forth by ion implantation; subsequently the oxide semiconductor film 13 is necessary to be activated by annealing. In FIG. 14, the aluminum oxide formed on the surface of the aluminum during the annealing is used as the second aluminum oxide film 32. This structure can also perform the same function of the subject invention as explained in first embodiment and second embodiment.

Figure 15:
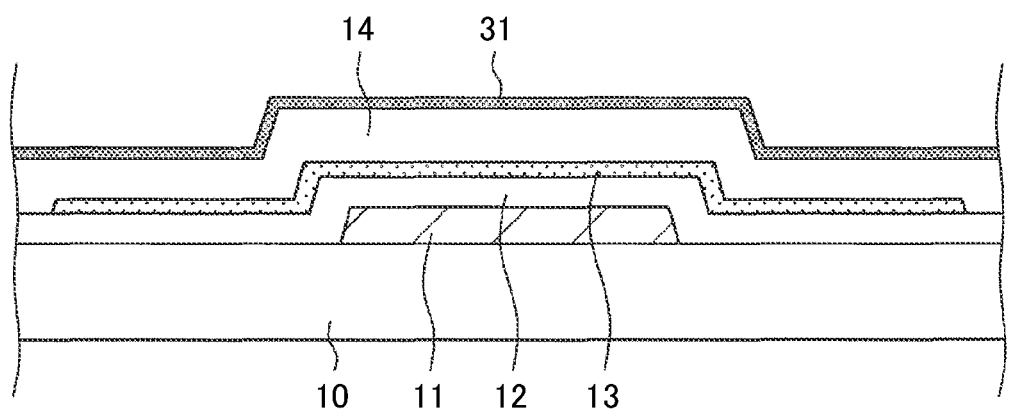
FIG. 15 is a cross sectional view that the first aluminum oxide film is formed on the insulating film.

FIGS. 15-18 are cross sectional views of the process to constitute the structure of FIG. 14. FIG. 15 is a cross sectional view that the first aluminum oxide film 31 is formed by oxygen reactive mode sputtering on the insulating film 14. Manufacturing method and thickness etc. of the first aluminum oxide film 31 is the same as explained in first embodiment.

Figure 16:
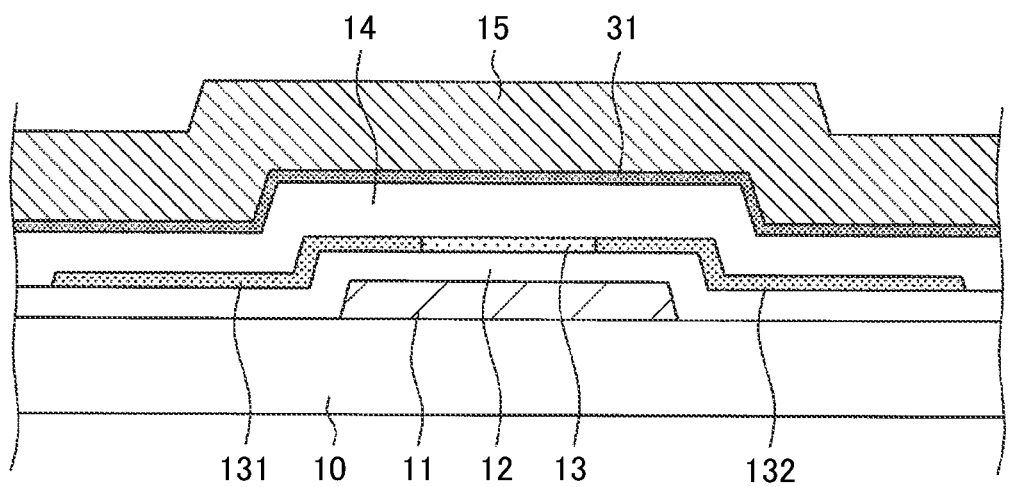
FIG. 16 is a cross sectional view that the metal for the gate electrode is formed on the first aluminum oxide film.
Figure 17:
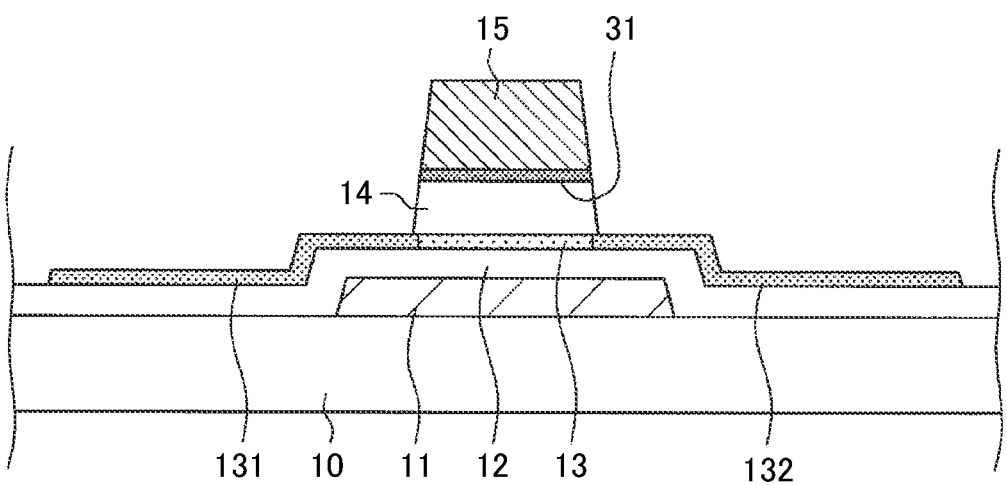
FIG. 17 is a cross sectional view that the gate electrode, the first aluminum oxide film and the insulating film are patterned.

FIG. 16 shows the aluminum film, which constitutes gate electrode 15, is formed by sputtering etc. over the first aluminum oxide film 31. FIG. 17 is a cross sectional view that the gate electrode 15, the first aluminum oxide film 31, the insulating film 14 are patterned. In FIG. 17, the gate electrode 15 made of aluminum is formed directly on the first aluminum oxide film 31. In FIG. 17, after the gate electrode 15 is patterned, the drain and the source of the oxide semiconductor film 13 are given conductivity except the portion under the gate electrode 15 of the oxide semiconductor film 13 by performing ion implantation using the gate electrode 15 as the mask.

Figure 18:
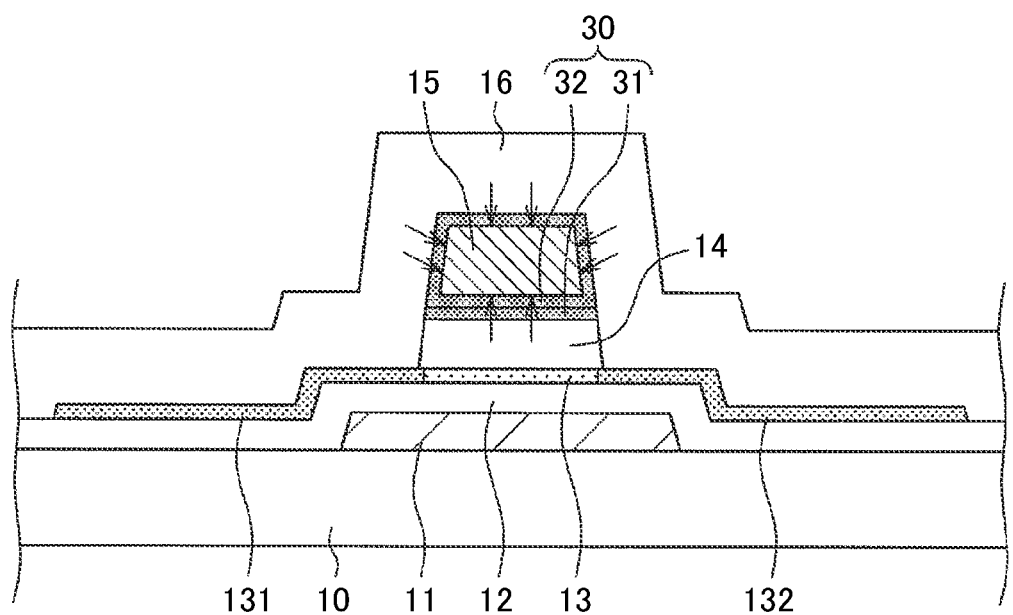
FIG. 18 is a cross sectional view that annealing is conducted after the interlayer insulating film is formed over the gate electrode and the oxide semiconductor.

FIG. 18 is a cross sectional view, in which the gate electrode 15 and the oxide semiconductor film 13 etc. are covered by the interlayer insulating film 16; then the aluminum oxide film is being generated on the surface of the gate electrode 15 by annealing at 250 centigrade to 350 centigrade. In FIG. 18, a thickness of the second aluminum film 32, formed between the gate electrode 15 and the first aluminum oxide film 31 by annealing, is approximately 2 nm.

Figure 19:
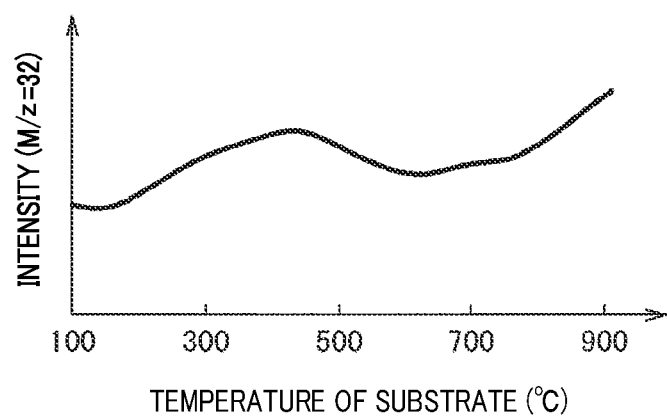
FIG. 19 is a graph that shows the relation between the temperature and oxygen desorption from the aluminum oxide film.

The oxygen for the formation of the second aluminum oxide 32 is supplied from the first aluminum oxide film 31. Since the first aluminum oxide film 31 is an oxygen rich film, it can supply oxygen to the gate electrode 15 during the annealing for the formation of the second aluminum oxide film 32. FIG. 19 is a graph that shows the amount of released oxygen when the aluminum oxide film is heated; the amount of oxygen released from the aluminum oxide is detected by TDS (Thermal Desorption Spectrometry).

In FIG. 19, the abscissa is the temperature of the substrate; the ordinate is the amount of oxygen released from the aluminum oxide, namely, intensity of $O_2$ (atomic weight is 32). In FIG. 19, desorption of oxygen increases in proportion to the temperature in the region of 100 centigrade to approximately 350 centigrade. FIG. 19 shows a relative value; however, when the amount of oxygen in the aluminum oxide film is bigger, the amount of desorption of oxygen increases.

Back to FIG. 18, the second aluminum oxide film 32 is formed not only between the gate electrode 15 and the first aluminum oxide 31 but also formed between the gate electrode 15 and the interlayer insulating film 16. In this case, the oxygen is supplied from the surrounding interlayer insulating film 16, which is made of SiO. Therefore, the second aluminum oxide film 32 covers all around the gate electrode 15 made of metal, thus, absorption of oxygen by the gate electrode 15 is suppressed.

The oxygen concentration in the second aluminum oxide film 32 that is formed by annealing is lower than that of the first aluminum oxide film 31. Therefore, the distribution of oxygen in the aluminum oxide film 30 is the same as that in first embodiment and second embodiment.

Figure 20:
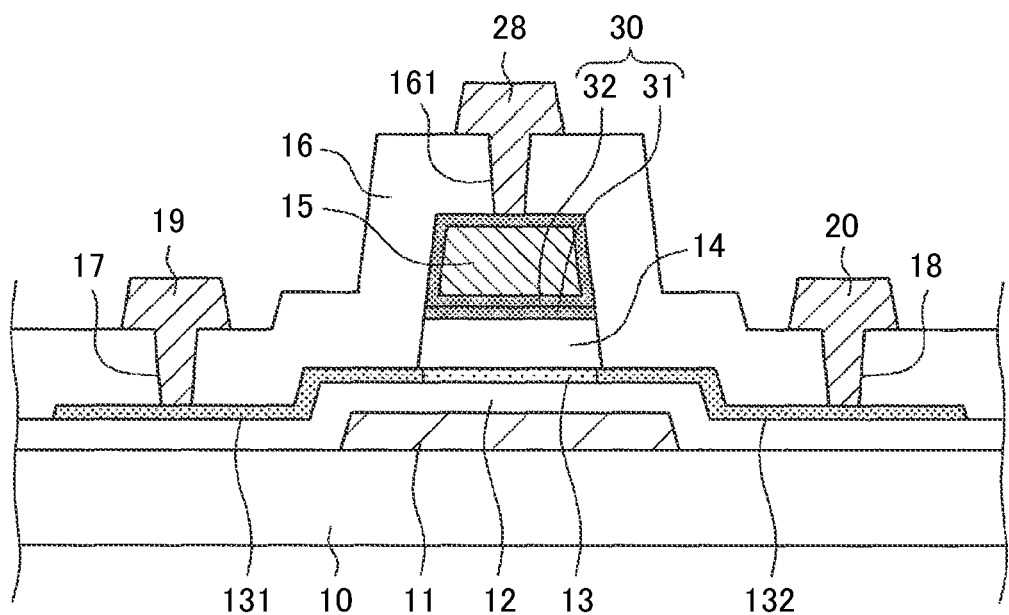
FIG. 20 is a cross sectional view that shows a problem of electrical connection to the gate electrode according to third embodiment.

By the way, when the aluminum oxide film is formed on the surface of the gate electrode by annealing, there could occur a problem of an electrical connection between the gate electrode 15 and the upper electrode 28 or other wirings as depicted in FIG. 20. Unlike FIG. 2, the gate electrode 15 in FIG. 20 is supplied with gate voltage from the upper electrode 28 via through hole 161 in the insulating film 16. In FIG. 20, the aluminum oxide film 32, which is an insulator, exists between the upper electrode 28 and the gate electrode 15.

Figure 21:
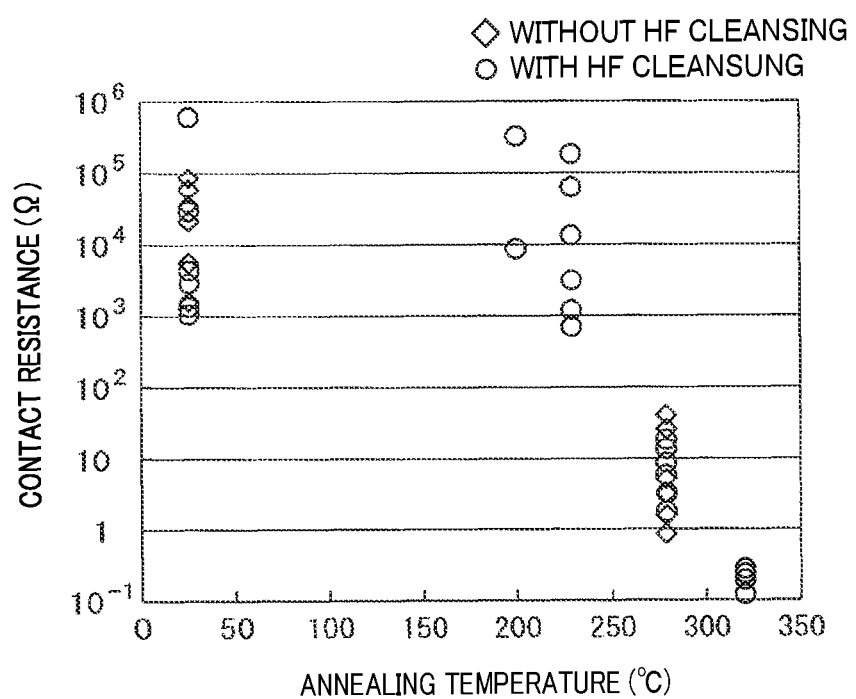
FIG. 21 is a graph that shows a way to solve the problem of electrical connection of the gate electrode in the through hole according to third embodiment.

FIG. 21 is a graph that shows a contact resistance when the substrate is annealed, in the structure shown in FIG. 20. In FIG. 21, the abscissa is annealing temperature; the ordinate is a contact resistance between the gate electrode 15 and the upper electrode 28 in the contact hole 161.

As depicted in FIG. 21, when annealing temperature is 250 centigrade or more, the contact resistance between the electrode 28 and the gate electrode 15 drastically decreases and approaches to an insignificant value that is essentially no problem. The possible reason is that: since the aluminum oxide film formed by annealing is in a thickness of approximately 2 nm, the metal, constituting the gate electrode 15, or the metal, constituting electrode 28, diffuses into the aluminum oxide film 32 when annealing is conducted with high temperature; even the amount of diffusion may be small, electrical connection in the through hole can be achieved.

In general, in order to decrease the contact resistance in the through hole, the through hole is cleansed with hydro fluoride (HF). In FIG. 21, circles are without HF cleansing; rhombuses are with HF cleansing. FIG. 21, however, shows that raising the temperature of annealing is more effective to decrease the contact resistance in the through hole than cleansing the through hole with HF. As described above, if a problem of contact resistance due to the aluminum oxide formed by annealing occurs, the following process is effective: forming the through hole for electrical connection, forming the electrode for connection in the through hole, after that, the annealing is applied to decrease the contact resistance in the through hole.

Fourth Embodiment

In first embodiment to third embodiment, the invention is explained in the case of top gate type TFT, in which the gate electrode is set above the oxide semiconductor film 13. The present invention, however, is applicable to the bottom gate type TFT, in which the gate electrode 15 is set beneath the oxide semiconductor film 13, too. Further, the present invention is applicable to the dual gate type TFT, in which the gate electrode 15 exists both above and beneath the oxide semiconductor film 13.

Figure 22:
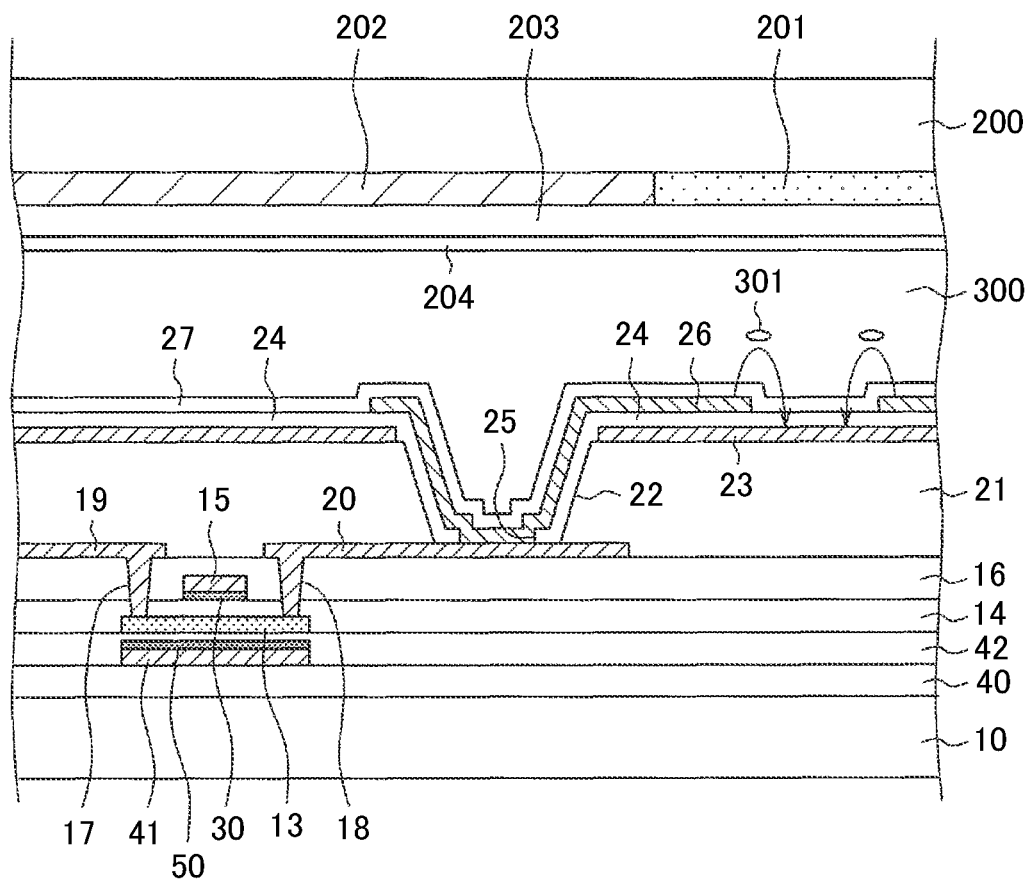
FIG. 22 is a cross sectional view of the liquid crystal display device according to fourth embodiment.

FIG. 22 is a cross sectional view of the pixel area in the liquid crystal display device which uses the dual gate type TFT, in which the gate electrode 15 is above the oxide semiconductor film 13 and the gate electrode 41 is beneath the oxide semiconductor film 13. FIG. 22 differs from FIG. 4 in first embodiment in that the bottom gate 41 is set beneath the oxide semiconductor film 13.

In FIG. 22, the second under coat film 40 is formed on the substrate 10, which is made of glass and so forth. The second under coat film 40 has a plural layer structure formed by SiN film and SiO film. The bottom gate electrode (the second gate electrode) 41 is formed on the second under coat film 40. The second gate electrode 41 has also a role of light shading film for the oxide semiconductor film 13.

The aluminum oxide film 50 is formed on the second gate electrode 41. This aluminum oxide film 50 has a same role as the aluminum oxide film 30 in the top gate. The aluminum oxide film 50 also has a two layer structure as with the aluminum oxide film 30, however, the processing order of the first aluminum oxide 51 and the second aluminum oxide 52 is different.

After that, the second gate insulating film 42 is formed. The second gate insulating film 42 is expressed as the under coat film in first embodiment. In this embodiment, the second gate insulating film 42 is made of SiO film. The second gate insulating film 42 can have a two layer structure of SiO film and SiN film. After that the oxide semiconductor film 13 is formed. The structure above the oxide semiconductor film 13 is the same as FIG. 3.

Figure 23:
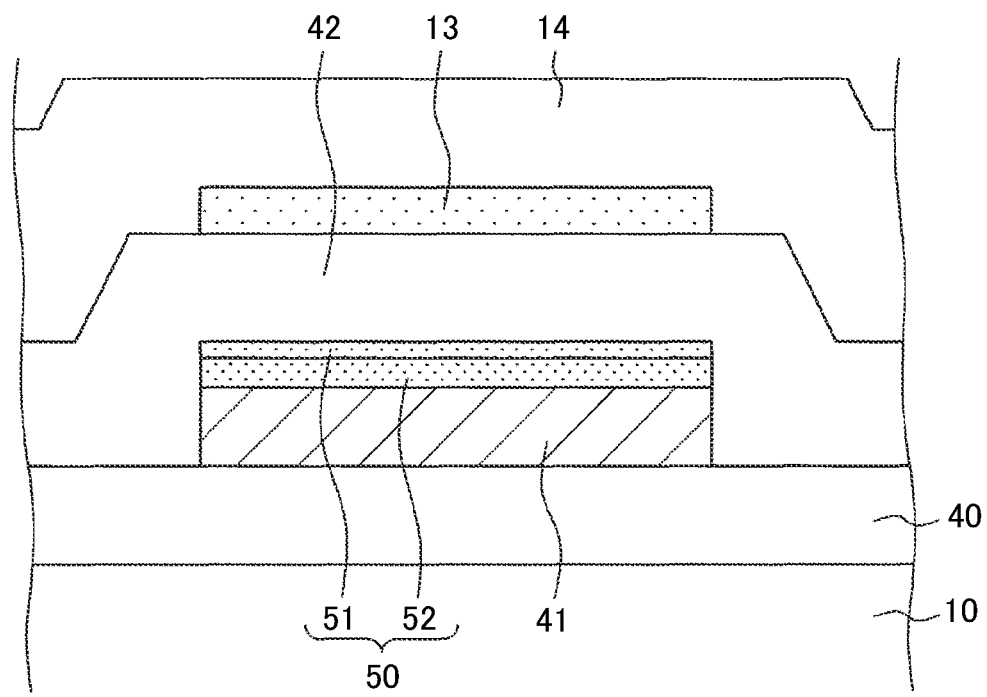
FIG. 23 is a cross sectional view of the liquid crystal display device that shows feature of fourth embodiment.

FIG. 23 is an enlarged cross sectional view of the second gate electrode 41 and its vicinity. In FIG. 23, the second gate electrode 41 made of e.g. aluminum is formed on the under coat film 40, which is formed on the substrate 10. The aluminum oxide film 50 is formed on the second gate electrode 41; the lower layer, which is formed first, is the second aluminum oxide film 52, formed in a thickness of 5 to 10 nm by transition mode sputtering. The oxygen rich first aluminum oxide film 51 is formed in a thickness of 2 to 5 nm, preferably 2 nm, by oxygen reactive mode sputtering on the second aluminum oxide film 52.

The manufacturing method is as follows. The metal for the second gate electrode 41 is formed by sputtering on the second under coat film 40; the second aluminum oxide film 52 is formed by transition mode sputtering on the second gate electrode 41; the first aluminum oxide film 51 is formed by oxygen reactive mode sputtering on the second aluminum oxide film 52. After that the resist is coated and patterned by photo lithography, subsequently, the first aluminum oxide film 51, the second aluminum oxide film 52 and the second gate electrode 41 are patterned by dry etching or wet etching.

After that, the second gate insulating film 42 is formed covering the first aluminum oxide film 51. The second gate insulating film 42 is made of SiO. The second gate insulating film 42 can be a two layer structure of SiO film and SiN film; in this case, the SiO film is set to contact the oxide semiconductor film 13. The oxide semiconductor film 13 is formed by sputtering and patterned. The process after that is the same as first embodiment.

The functions of the first aluminum oxide film 51 and the second aluminum oxide film 52 in FIGS. 22 and 23 are the same as the first aluminum oxide film 31 and the second aluminum oxide film 32 explained in first embodiment. As described above, the present invention can be applied to the TFTs of the bottom gate type and the dual gate type.

In first embodiment to fourth embodiment, it was explained that the two layers of aluminum films were formed between the insulating film and the gate electrode. However, even two layer structure is formed initially, a boundary between the first aluminum oxide film 31 and the second aluminum oxide film 32 may become obscure due to annealing process and so forth, which is applied later. Even this case, concentration of oxygen in the aluminum oxide film is larger at the side of the insulating layer than at the side of the gate electrode.

In first embodiment to fourth embodiment, it was explained that the gate electrode was made of metal, its major substance is aluminum. The present invention is, however, applicable to the case where the gate electrode is made of other metals that can form metal oxide at the surface, like Ti (Titanium).

In the above explanation, the present invention was explained in the case of IPS mode liquid crystal display device. The present invention is, however, applicable to other types of liquid crystal display devices. The organic EL display device also uses the oxide semiconductor TFTs. The cross sectional structure of the organic EL display device is basically the same as FIG. 3 up to formation of the organic passivation film 21. Therefore, the present invention explained above can be applied to the organic EL display device.

What is claimed is:

1. A semiconductor device comprising:
   an oxide semiconductor film,
   a gate electrode, and
   a gate insulating film arranged between the oxide semiconductor film and the gate electrode,
   wherein an aluminum oxide film is arranged between the gate insulating film and the gate electrode,
   the aluminum oxide film has a first aluminum oxide film and a second aluminum oxide film,
   the gate insulating film is made of silicon oxide, a first oxygen concentration in the first aluminum oxide film is bigger than a second oxygen concentration in the second aluminum oxide film.

2. The semiconductor device according to claim 1, wherein a thickness of the second aluminum oxide film is bigger than a thickness of the first aluminum oxide film.

3. The semiconductor device according to claim 2, wherein a thickness of the first aluminum oxide film is 2-5 nm.

4. The semiconductor device according to claim 2, wherein a thickness of the second aluminum oxide film is 5-10 nm.

5. The semiconductor device according to claim 1, wherein the gate insulating film is formed between the gate electrode and the oxide semiconductor film, and the gate insulating film is not formed on a drain or a source of the oxide semiconductor film.

6. The semiconductor device according to claim 5, the aluminum oxide film and the gate electrode are formed by patterning after stacking to cover the oxide semiconductor.

\* \* \* \* \*